United States Patent [19]

Hollister

[11] Patent Number: 4,578,667
[45] Date of Patent: Mar. 25, 1986

[54] DIGITAL ACQUISITION SYSTEM INCLUDING A HIGH-SPEED SAMPLING GATE

[75] Inventor: Allen L. Hollister, Beaverton, Oreg.
[73] Assignee: Tektronix, Inc., Beaverton, Oreg.
[21] Appl. No.: 593,010
[22] Filed: Mar. 23, 1984
[51] Int. Cl.⁴ .......................................... H03M 13/00
[52] U.S. Cl. ......................... 340/347 SH; 340/347 M
[58] Field of Search ................ 340/347 SH, 347 AD, 340/347 P, 347 DA; 324/103 P, 99 D, 121 R, 97, 73; 364/487, 575

[56] References Cited
U.S. PATENT DOCUMENTS

| 4,030,840 | 6/1977 | Lawton et al. | 324/121 R |
| 4,053,831 | 10/1977 | Furukawa et al. | 324/121 R |
| 4,225,940 | 9/1980 | Moriyasu et al. | 340/347 SH |
| 4,283,713 | 8/1981 | Philipp | 340/347 SH |
| 4,399,512 | 8/1983 | Soma et al. | 324/121 R |
| 4,495,586 | 1/1985 | Andrews | 364/487 |

Primary Examiner—William M. Shoop, Jr.
Assistant Examiner—Sharon D. Logan
Attorney, Agent, or Firm—George T. Noe

[57] ABSTRACT

A digital acquisition system includes a high-speed sampling gate with analog memory for sampling input signals. The samples are converted to digital representations and stored in a digital memory. The digital representations are selectively recalled from the digital memory and fed back as estimators to the sampling gate's analog memory. Since the estimators are essentially the previous samples for each point of a given waveform, the stored waveform converges to the input waveform very quickly, facilitating accurate waveform replication. Embodiments for both sequential sampling and pseudo-random sampling are provided. Operational techniques of the digital acquisition system include noise reduction, loop gain determination, adaptive filtering and signal averaging.

19 Claims, 9 Drawing Figures

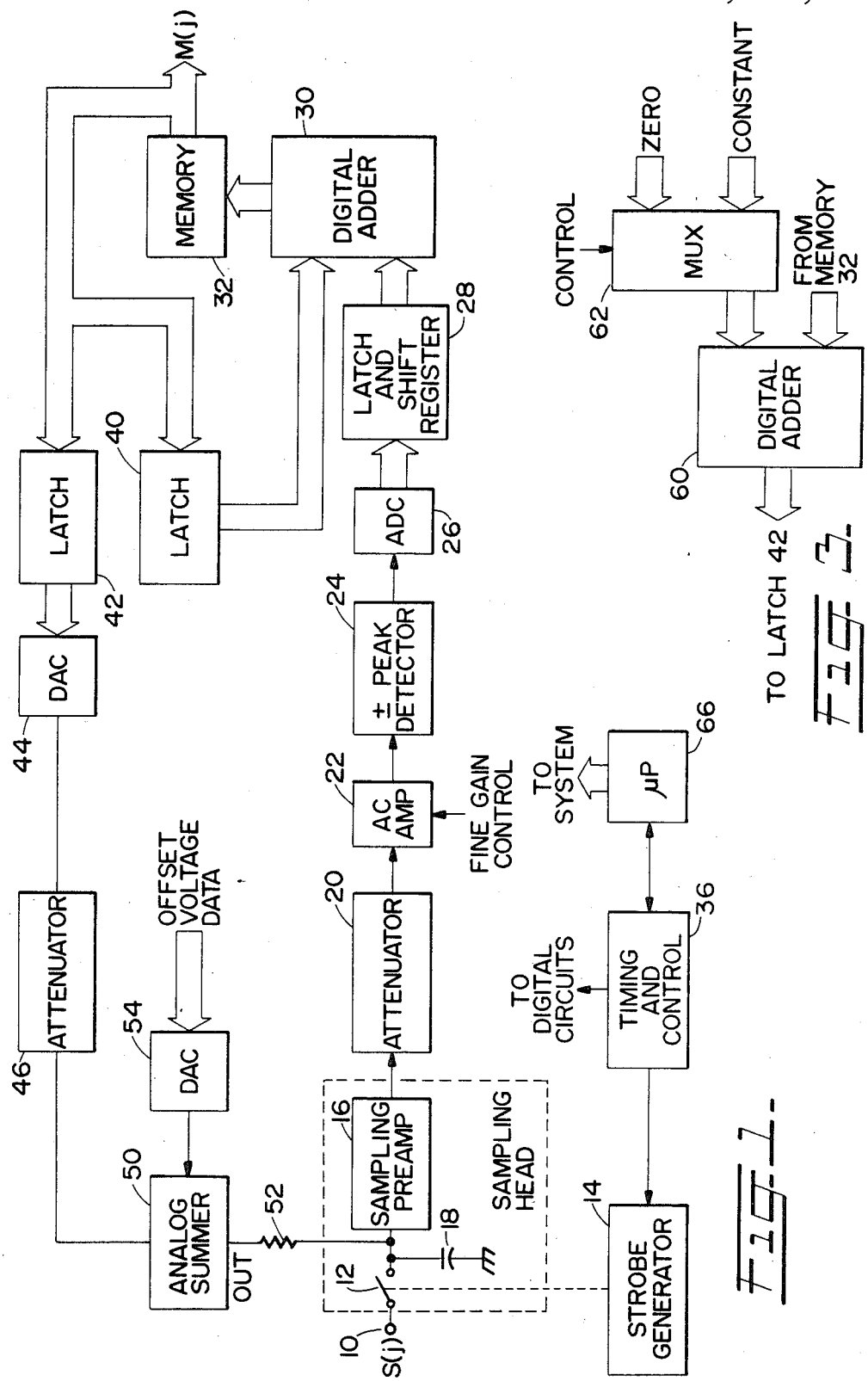

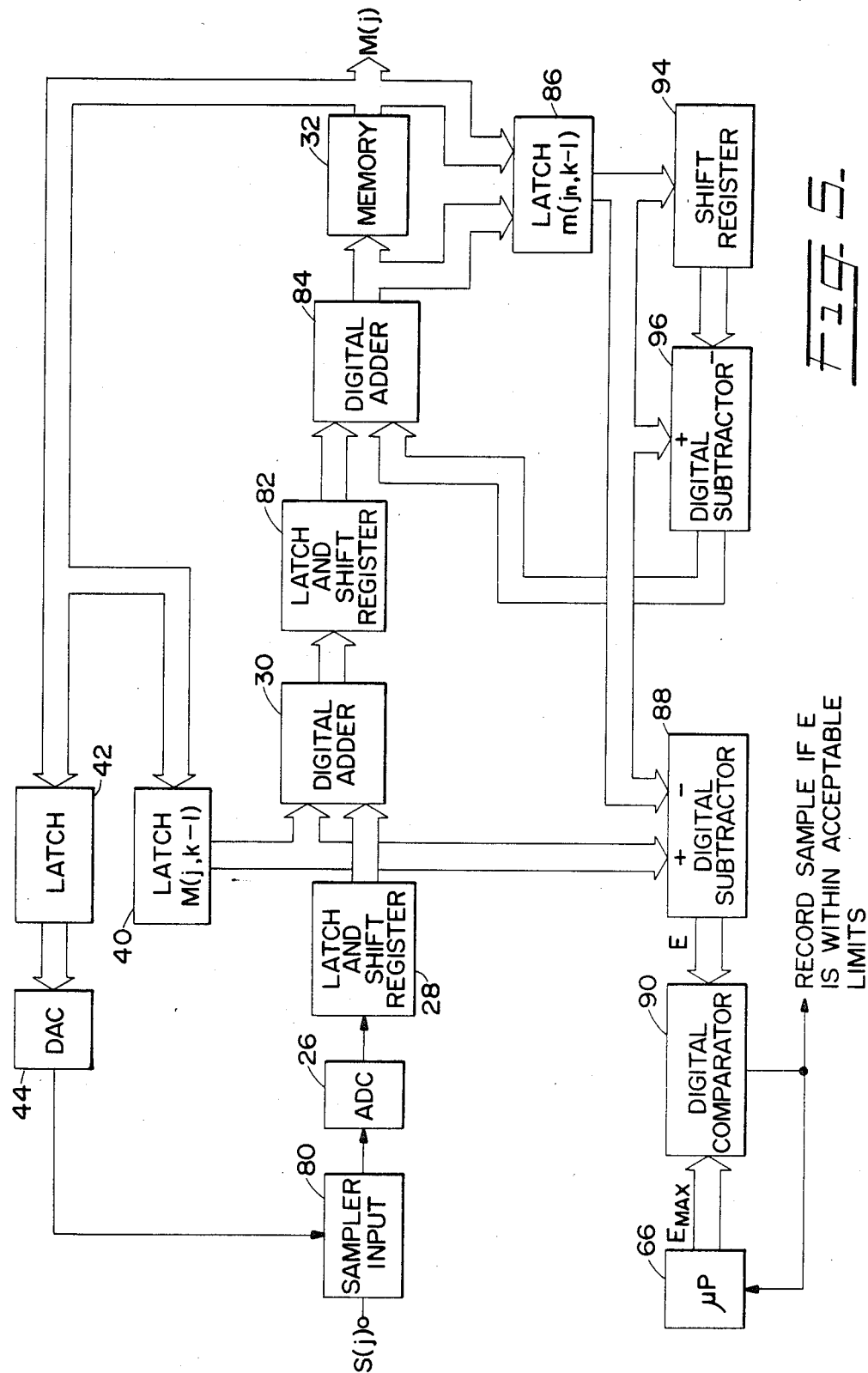

DIGITAL ACQUISITION SYSTEM INCLUDING A HIGH-SPEED SAMPLING GATE

BACKGROUND OF THE INVENTION

Sampling oscilloscopes were developed more than twenty years ago to respond to small, fast-changing signals that conventional oscilloscopes could not respond to because of limited bandwidth or risetime characteristics. Sampling is a now well-known technique in which the signal path is gated for an extremely short period of time to pass the substantially instantaneous amplitude value (voltage sample) of the electrical signal during that period. Each sample taken in this manner is processed by electronic circuits and displayed at an appropriate respective time position. Since the samples appear on a cathode-ray tube (CRT) display as dots, a large number of samples are required to reconstruct a waveform. Generally speaking, sampling is practical primarily when the electrical signal is repetitive in nature since in most cases it is impossible or impractical to acquire all of the needed samples during a single event or single cycle of the signal. Indeed, one of the practical advantages of sampling is that at least one sample can be acquired from each of a large number of cycles, and a representative waveform may be reconstructed and displayed therefrom.

Sampling modes are typified in accordance with the timing method used. Sequential sampling is a mode in which the display is comprised of a very orderly series of equally spaced dots. Random sampling is a mode in which successive dots may occur at what appears to be random horizontal positions because the sampling timing and signal triggering are unrelated, although it must be pointed out that with random sampling the reconstructed waveform is defined because the dots are inserted into the display at substantially correct time positions. Real-time sampling is a mode in which the electrical signal is very slow, allowing all of the samples to be acquired on one cycle so that the waveform displayed is the one actually sampled.

Prior art sampling systems, referred to herein as classic samplers, include a high-speed sampling gate, a sampling capacitor, a memory gate, a memory capacitor, associated amplifiers including a sampling preamplifier and a memory amplifier, and a feedback attenuator from the memory amplifier output to the sampling preamplifier input. A sampling loop is formed having a forward gain from input to output and a feedback attenuation factor from output to input to establish a loop gain which is ideally unity. The purpose of the feedback attenuator is to place a voltage on the sampling capacitor which is equal (for unity loop gain) to the last sample taken and an estimator of the next sample to be taken. With each sample, the memory output repeatedly attempts to reduce to zero the voltage existing between the input and output of the sampling gate. If the input voltage is the same each time it is sampled, the feedback matches it, reducing the difference and the size of each amplified step to practically zero. The ability of a sampling oscilloscope to display correctly the voltage change between any two successive samples is known as dot transient response, and good dot transient response requires unity loop gain.

There are situations in which it is desirous to have a loop gain which is not equal to one. For example, in a process known as smoothing, i.e., reducing the effect of random noise or jitter in the display, the loop gain is set to some value less than one. However, smoothing results in a degraded dot transient response since the estimator placed on the sampling capacitor is derived from the previous sample, may be different from the new sample about to be taken. The viewed reconstructed waveform has the appearance of having been passed through a low-pass filter, and while noise is reduced on the displayed waveform, the leading edge of a square-wave pulse is rolled off. Moreover, signal noise is not completely eliminated, and in certain situations appears smeared along the displayed waveform. Smoothing with random sampling is impossible because of the unpredictability of where a sample is taken.

Other problems associated with prior art classical samplers include distortion and inaccuracies due to the sampling loop always being open to some extent, difficulties in determining what loop gain actually is, memory "droop" due to capacitor leakage, and complexities in building and making accurate portions of the analog system because even component lead lengths are often critical.

SUMMARY OF THE INVENTION

In accordance with the present invention, a closed loop sampling system includes a high-speed analog sampling gate with analog memory, and a digital memory and waveform processing section. The sampling loop comprises a forward signal-processing path from the sampling gate to a digital memory, and a feedback path from the digital memory to the sampling gate's analog memory for feeding back estimators of the next sample. Because the estimators are selected from digital memory, the stored waveform converges to the input waveform in just a few passes so that accurate waveform replication is achieved. Embodiments for both sequential sampling and pseudo-random sampling are provided. These embodiments include circuitry for determining loop gain as a function of voltage across the sampling gate, improving signal-to-noise ratio, adaptive filtering within the sampling loop, and signal averaging.

An important feature of the present invention is to provide a high-speed sampling system in which waveforms are digitized. Moreover, the entire system operates under digital control. Problems associated with classic analog samplers, such as slashing, memory droop, poor dot transient response, and signal distortion and inaccuracies, are eliminated. This makes the system easier to construct and operate from a user standpoint.

Another feature of the present invention is that for a repetitive input signal in the closed loop case of the sampling loop, the stored waveform substantially always converges to the input signal, eliminating nonlinearities and thereby improving accuracy. Each sample point is independent of all other sample points, and each sample point has its own unique memory address. This feature permits sampling with relatively large time intervals between points (low dot density) without any attendant edge rolloff or aberration. Also, noise spikes will be substantially reduced rather than being smeared along the displayed waveform.

Another feature of the present invention is the ability to measure loop gain and precisely adjust it to any desired value, such as unity, or values less than unity for signal averaging and digital filtering.

Another feature of the present invention is to measure the amount of open loop condition when operating in random sampling mode, i.e., the difference between an acquired sample and its estimator, permitting rejection of erroneous samples.

Another feature of the present invention is that the general system permits almost any type of averaging algorithm to be used, including boxcar, exponential, and smoothing.

Another feature of the present invention is the ability to provide conversion bits beyond the capability of an encumbent analog-to-digital converter.

Other features, advantages, and attainments of the present invention will become obvious to one having ordinary skill in the art upon a reading of the following description when taken in conjunction with the accompanying drawings.

DRAWINGS

FIG. 1 is a block diagram of a digital acquisition system including a high-speed sampling gate in accordance with the present invention;

FIG. 7 shows a modification of the system of FIG. 1 to provide a determination of loop gain;

Figure 4A:
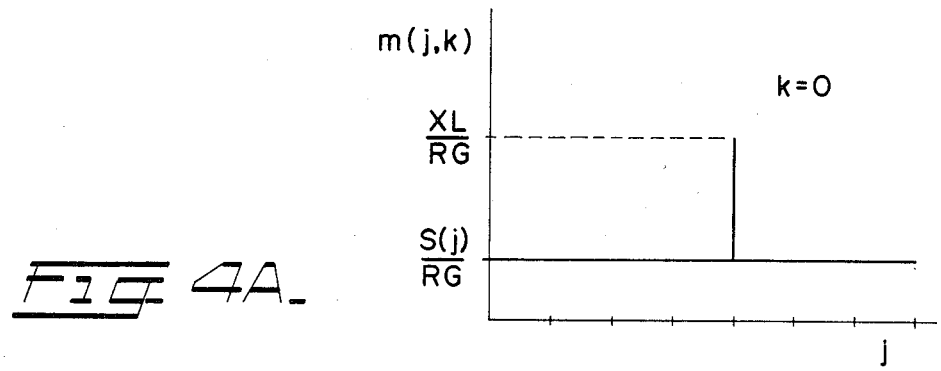
Figure 4B:
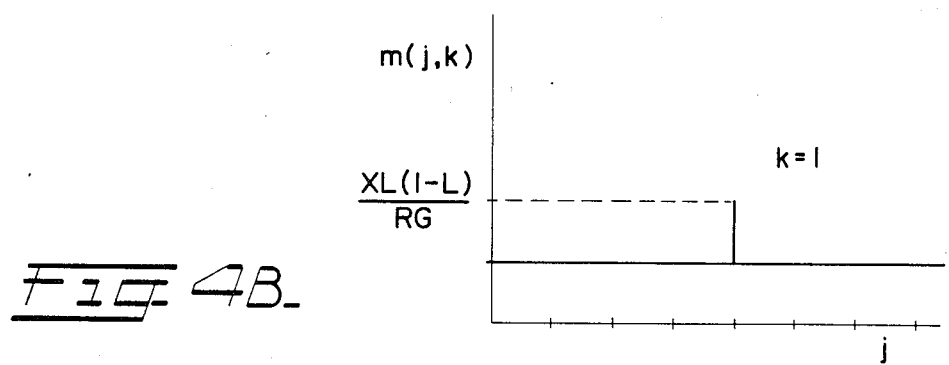
Figure 4C:
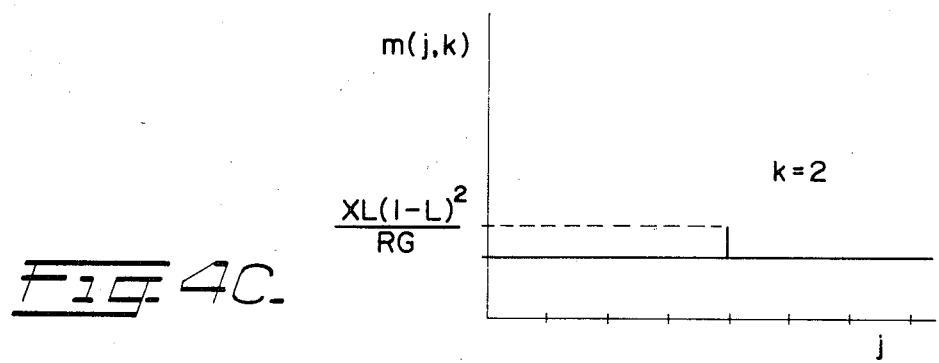
Figure 5:
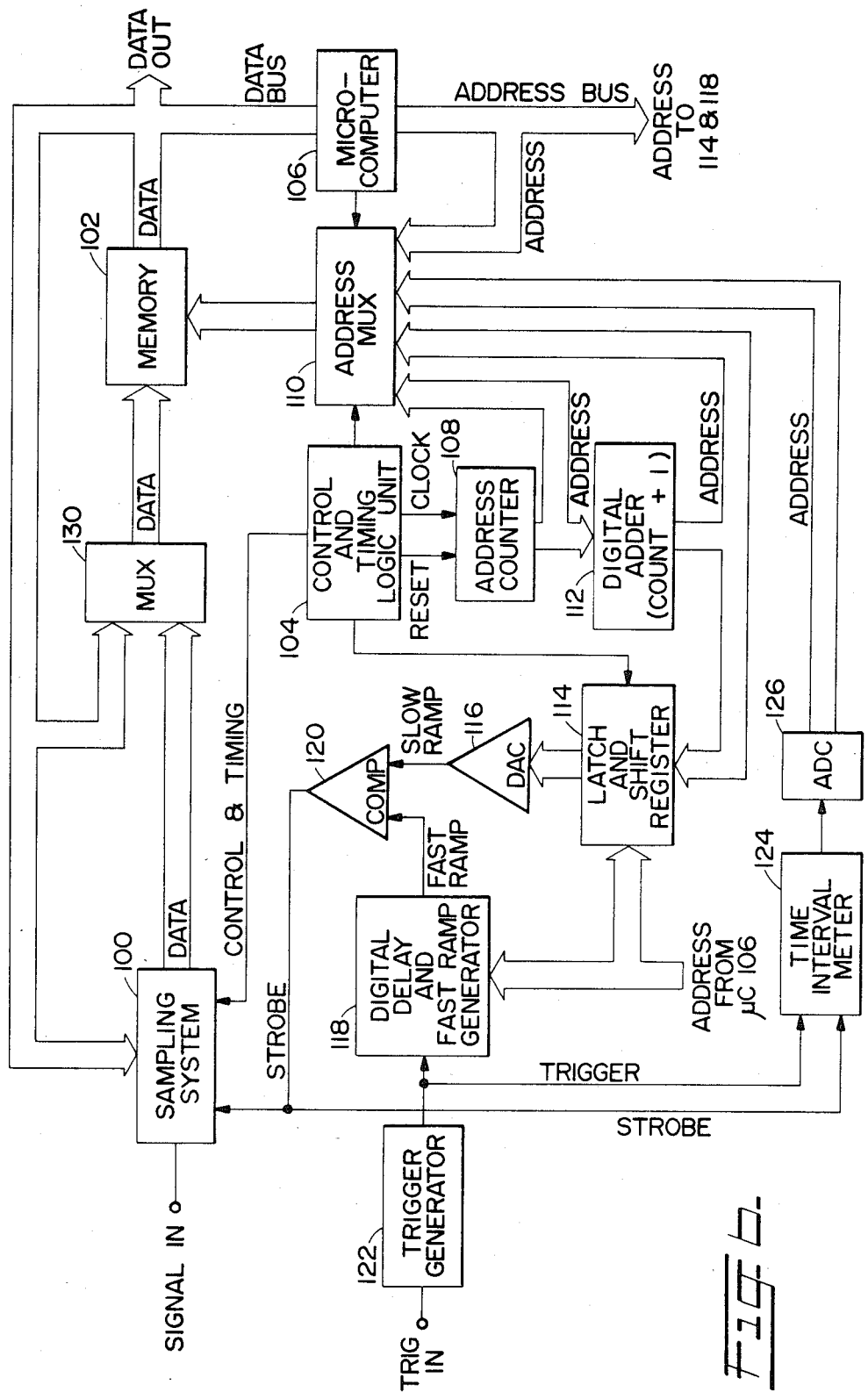

FIGS. 4A, 4B, and 4C show the effects of noise filtering in the system of the present invention;

FIG. 5 is a block diagram of the system of the present invention modified for random sampling operation; and FIG. 6 is a block diagram of the timing and control system associated with the sampling system of the present invention.

DETAILED DESCRIPTION OF THE INVENTION

Referring now to FIG. 1, there is shown a block diagram of a sampler in accordance with the present invention. The sampler is arranged in a loop comprising a forward signal-processing section and a reverse or feedback section for feeding back an estimate of what the next sample to be taken will be. The input to the sampler is an analog signal S(j) and the output is digital data M(j).

The input signal S(j) is applied via an input terminal 10 to a sampling gate 12. The purpose of sampling gate 12 is to block the input signal except during very brief time periods (e.g., 350 picoseconds) when the signal voltage is allowed to go through the gate. Sampling gates are well-known in the art and the typical sampling gate may comprise two to six high-speed, low-storage diodes arranged in a bridge which is actuated by very short duration strobe pulses. Field-effect transistor (FET) gates have been successfully employed as well. Here, sampling gate 12 is actuated by strobe pulses from strobe generator 14, which may suitably be a conventional push-pull strobe generator which applies narrow pulses of opposite polarity to the sampling gate diodes (or other devices) in response to sampling-command pulses from a timing and control section to be described later in connection with FIG. 6.

The signal voltage sample passed by the sampling gate 12 is applied to a sampling preamplifier 16. There is typically a small amount of stray capacitance to ground at the input of the sampling preamplifier, forming an analog memory represented by sampling capacitor 18 in FIG. 1, and this capacitance gets partially charged to the voltage which exists on the input side of the sampling gate. The capacitance would get fully charged if the strobe pulses were wider (i.e., the voltage sample existing for a longer time). When the sampling gate 12 stops conducting, a small voltage will have been developed across this capacitance and will last for a relatively long time because it has a high-resistance path through which to discharge. The sampling preamplifier 16, which may be an AC difference amplifier, responds to the sample voltage, which is a step signal if the input signal S(j) is not in a steady state, and the output of sampling preamplifier 16 is applied via an attenuator 20 to an AC-amplifier stage 22. The elements so-far described are found in conventional high-speed samplers, and the actual circuit construction is well known to those skilled in the art. The attenuator 20 typically has a plurality of selectable attenuation ratios to facilitate selection of vertical deflection factors of the sampling oscilloscope cathode-ray tube display. AC amplifier 22 may suitably be a variable gain amplifier to permit gain adjustment of the system, and, accordingly, a fine gain control voltage may be applied thereto from a front-panel control, or, from a programmable or microprocessor-controlled source. The sampling gate 12, sampling preamplifier 16, and analog memory represented by sampling capacitor 18 (which may be a physical capacitor as well as stray capacitance) may be included in a sampling head having specified risetime, impedance, and offset voltage parameters to permit interchangeability with other sampling heads to match the characteristics of the input signal source.

AC amplifiers, which respond better to fast signals than DC amplifiers, are typically utilized in sampling inputs because of the high-speed transient nature of the samples through the sampling gate. This does not mean, however, that in a particular sampling system DC amplifiers cannot be employed.

The output of AC amplifier 22 is applied to a peak detector 24, which suitably may be of the type in which capacitors are quickly charged to the peak voltage of either polarity and then held for a predetermined length of time before being rapidly discharged. This stretches the samples out and allows analog-to-digital converter (ADC) 26, which is connected to the peak detector output, time to convert the analog voltage level to a digital value before the peak detector is reset and a new sample taken. The digital data from ADC 26 is routed via latch/shifter register 28 and digital adder 30 to digital memory 32 under control of control and address signals from timing and control unit 36. The ADC, latch/shift register, adder, and digital memory are commercially available integrated circuits.

Digital data M(j) from digital memory 32 is made available at the system output; such digital data is also applied to latches 40 and 42. The data temporarily stored in latch 40 is algebraically added to data stored in latch/shift register 28, for reasons which will become apparent when circuit operation is discussed. The data from latch 42 is applied to digital-to-analog converter (DAC) 44 to develop an analog voltage level corresponding to the value of the digital data. The output of DAC 44 is attenuated by attenuator 46 and applied via an analog summer 50 and stabilizing resistor 52 to the input of sampling preamplifier 16. Also applied to analog summer 50 is an offset voltage shown produced by DAC 54 from a programmable data source; however, such offset voltage could also be provided from a front-panel potentiometer. The purpose of the offset voltage, which may be zero volts as well as some positive or negative value, is to set the input of sampling preamplifier 16 to the DC level of the input signal source so that only signals riding on the DC level pass through the sampling gate.

The overall system gain from input terminal 10 to the output of digital memory 32 is defined as loop gain (L), and is the product of forward gain (FG) and reverse gain (RG). Forward gain includes sampling efficiency, defined as the percentage of signal voltage transferred across the sampling gate 12 when the gate conducts, as well as the gain of the sampling preamplifier 16, attenuator 20, AC amplifier 22, and any slight losses in signal in the peak detection and analog-to-digital conversion stages. Latch/shift register 28 also may affect forward gain because shifting the latched data divedes it down, apparently reducing the gain. Reverse gain is the gain from the output of digital memory 32 back to the input of sampling preamplifier 16, and is determined primarily by attenuator 46, with feedback attenuation expressed as gain even though the reverse gain is less than unity. While it is desirable that loop gain L be unity, as it was for conventional classical samplers, it is not essential for certain sampling operations. Loop gain will be discussed further in connection with some of these operations.

SEQUENTIAL SAMPLING OPERATION

For sequential sampling operation, strobe generator 14 provides short-duration strobe pulses to sampling gate 12 at equally-spaced intervals and at a predetermined repetition rate to take a number j of samples along a waveform. Timing and control unit 36 controls the operation of the various elements around the sampling loop in synchronism with the strobe pulses such that each sample is processed through the system before a new one is taken. Initially, before a particular waveform is sampled, the contents of digital memory 32 at all addressable locations therein, and latches 40 and 42 preferably are reset to zero to ensure optimum dynamic range. Just before the first sample is taken at a point $j=1$, the memory location corresponding to $j=1$ is addressed in memory 32, latched into latch 42, converted to an analog voltage (zero volts in this case) by DAC 44, attenuated and applied to sampling capacitor 18 as an estimate of what the sampled voltage will be. Then the sample at $j=1$ is taken, and the output of sampling preamplifier 16 represents the difference between the sample voltage and the estimator. This difference voltage is stored in peak detector 24 (with polarity sign) and ADC 26 begins conversion. Once the difference voltage is stored in peak detector 24, memory 32 may be addressed at the $j+1$ ($j=2$ in this case) location to obtain the next extimator, which is latched into latch 42, converted to analog form and placed on the sampling capacitor, allowing plenty of settling time before the sample at $j=2$ is taken. Meanwhile, the output of ADC 26 is latched into latch 28. Thereafter, the contents of latch 28 and latch 40 (still containing the $j=1$ estimator) are added together by digital adder 30 and then stored in digital memory 32 at the $j=1$ location. As soon as the peak detector 24 is reset and at a steady state, another strobe pulse is applied to sampling gate 12 and the $j=2$ point on the waveform is sampled. This process is repeated until all of the points $j=\{0, 1, 2, 3, \ldots\}$ on the waveform are sampled and corresponding values stored at the appropriate address locations in memory 32. Note that for this "pass" of the waveform, all of the estimators placed on the sampling capacitor were equal to zero. The waveform stored in memory after one pass, however, is the input signal multiplied by the forward gain FG and may not necessarily be the signal level desired if forward gain is not unity or is unknown because of the non-linearity of the sampling gate or other factors which may affect forward gain. The waveform stored in memory, however, may provide point-by-point estimators if the input signal is repetitive and triggered at the same point. For example, when the $j=1$ point is sampled on the incoming waveform, the previous $j=1$ value is recalled from memory, converted to analog form, attenuated, and placed on the sampling capacitor. The difference is again amplified, peak detected, converted to digital form and added to the estimator to be stored in memory. This new value may also be used subsequently as as estimator, if another pass of the waveform is required.

The difference equation describing the system of FIG. 1 is $$M(j,k) = (L/RG)S(j) + (1-L)M(j,k-1), \qquad (1)$$

wherein k is the number of times that a point j is sampled, and M(j,k) is the value stored in memory representing the waveform at point j on the waveform, and after the system has repetitively sampled the waveform k times. Note that if loop gain $L=1$, the second term of the equation drops out, and after one pass the memory will contain the input signal S(j) times the scaling factor 1/RG. This is consistent with the description in the preceding paragraph since $FG=L/RG$. Also, equation (1) is a difference equation in terms of k and not j. This means that the waveform stored in memory will converge to the exact value of the input signal and will create a totally closed loop system. Solving the difference equation (1) for a step function input signal yields $$M(j,k) = (1/RG)S(j) + [M(j,0) - (1/RG)S(j)](1-L)^k, \qquad (2)$$

wherein M(j,0) is the initial condition of the memory. Here again, if $L=1$, the second term of the equation drops out. More significant, however, is the fact that even if loop gain is not unity, but anywhere between zero and two ($0 < L < 2$), the system will converge to S(j)/RG as the number of passes k approaches infinity. Thus, the system of the present invention is capable of measuring the exact input signal and will not produce a rolled-off effect on the leading corner of a step waveform when loop gain is reduced.

Figure 2A:
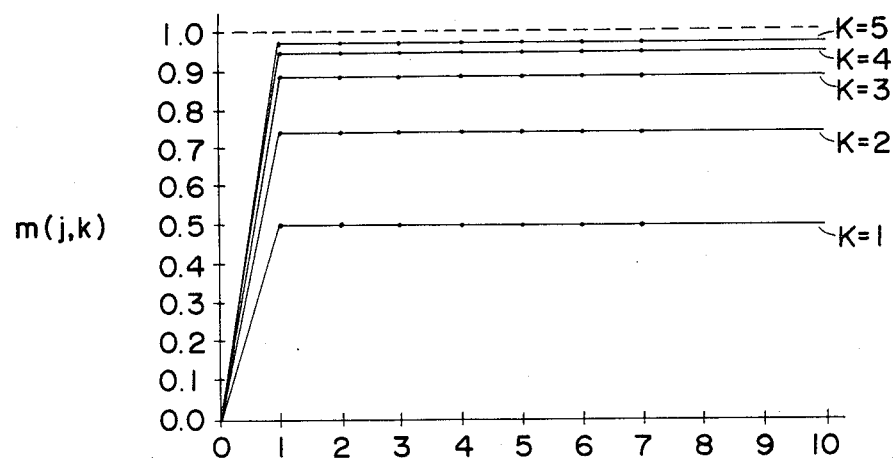
FIGS. 2A and 2B are waveforms illustrating unit step response for the system of the present invention in comparison with classical samplers.

A specific example of sequential sampling operation is shown in FIG. 2A, wherein the waveform M(j,k) in memory converges to a unit step input signal S(j) with the loop gain L arbitrarily set to 0.5 for purposes of explanation. Equation (2) then becomes $M(j,k) = 1 - 0.5^k$ for $j > 0$, and $M(j,k) = 0$ for $j \leq 0$. The initial value of the memory M(j,0) is zero for purposes of explanation. Inserting values (1, 2, 3, . . .) for k, it can be seen both mathematically and graphically that the amplitude converges to the correct value for each point along the waveform as the number of passes k increases. Note that for $k=7$ the amplitude stored in memory is 99.21% of the unit step input signal, illustrating that the amplitude converges to within one percent of the correct value in in only seven passes for a system having a loop gain of 0.5. It can also be seen that the measured signal always has the correct shape and is off by only a scaling factor, and, moreover, there is no rolloff on the front edge of the waveform.

Figure 2B:
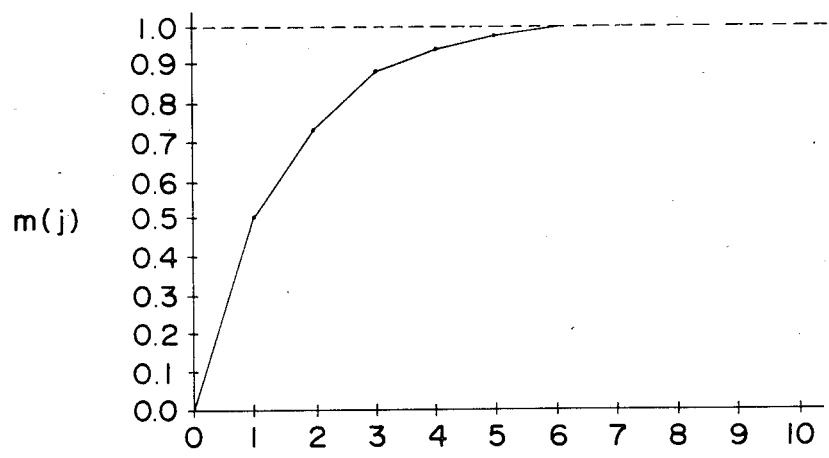

It may be instructive to compare the waveforms of FIG. 2A with that of FIG. 2B, which shows the rolloff attendant with a loop gain of 0.5 in a conventional sampler, wherein the j−1 point on the waveform is used as the estimator for the jth point. Thus, in the system of FIG. 1, the waveform may be reconstructed with low dot density without leading-edge distortion if the loop gain is not unity. The implication, of course, is that it is not necessary to oversample in order to obtain waveform integrity. For example, it may be possible to adequately sample a waveform by taking only 100 points along the horizontal axis instead of the 1000 points required by the conventional sampler. One advantage is that by recording fewer points, the time for complete waveform acquisition is shorter. Also, since the acquired waveform is in digital form, conventional digital oscilloscope techniques may be utilized to reconstruct and format a display, such as connecting the displayed dots by interpolation.

It should be mentioned that loop gain is still non-linear with respect to the voltage across the sampling gate. However, because the output waveform converges to the input signal, the voltage across the sampling gate must eventually converge to zero for every point on the waveform, irrespective of where the previous sample was taken. This means that the system is fully closed loop, and that potential distortion on the waveform due to this non-linearity is eliminated, resulting in an inherently more accurate signal replication by this system.

LOOP GAIN DETERMINATION

In operation of a closed-loop sampling digitizer, it is important to know loop gain, or at least for an associated microprocessor to have information as to loop gain. Loop gain information may be used to make the sampling digitizer perform certain averaging functions, to provide quicker convergence to the correct output waveform, and even to allow a random sampling system to be configured.

In this system, loop gain may be determined as a function of voltage across the sampling gate. An assumption that is made is that reverse gain (RG) is known, since only the DAC 44 and attenuator 46 affect RG, so that substantially all of the error in loop gain appears in the forward gain FG. This assumption is reasonable because forward gain includes the sampling efficiency factor, mentioned above, which is primarily a function of stobe width, source impedance, preamplifier input capacitance and input signal amplitude. Another assumption is that if the loop gain is anywhere near unity, the waveform in memory will quickly converge to the input signal within a few passes. This means that the estimators placed on the sampling capacitor are equal to the samples taken, so therefore the sampling gate has no voltage thereacross when it conducts. By adding or subtracting a constant value from the estimator at this point, the constant appears across the sampling gate when it conducts. This value is then processed through the forward section of the sampling loop, and, when stored in latch 28, is equal to the constant times the forward gain FG. By dividing this value by the constant, FG is determined, and so is loop gain L because RG is known. Because gain error may change with signal amplitudes, constants of several different values may be used to determine loop gain for these values, or an averaged measure of FG time the voltage across the sampling gate for several different constants may be attained.

The system of FIG. 1 may be modified as shown in FIG. 3 to provide a determination of loop gain. Here an adder 60 is interposed between the output of digital memory 32 and latch 42. A multiplexer 62 provides data to adder 60 to allow either zero or a predetermined constant to be added to the data from memory 32 under control of a microprocessor ($\mu$P) 66. Under normal operating conditions, of course, zero is selected by multiplexer 62 to be added to the data because it is not desired to modify such data in providing estimators to the sampling capacitor. However, when it is desired to determine loop gain, the constants, which may be computer generated, are selected by multiplexer 62 and added (or subtracted) to the data by adder 60. The circuit may be arranged to allow microprocessor 66 to directly read the contents of latch/shift register 28 for computation of loop gain.

IMPROVING SIGNAL-TO-NOISE RATIO

Prior to sampling a new waveform, digital memory 32 contains data which may be completely unrelated to the new input signal, and accordingly, the estimators provided to sampling capacitor 18 for the first pass should have a large error. Thus, it is not unreasonable to expect a large error voltage at the output of sampling preamplifier 16, and, in order to prevent clipping of the signal in AC amplifier 22, peak detector 24, and ADC 26, it is necessary for attenuator 20 to provide an appropriate reduction in the amplitude of the voltage samples passing therethrough. On subsequent passes, however, as the estimators provided by memory 32 begin to approach the input signal levels, less attenuation is required so as to keep the amplitude of processed samples above intrinsic channel noise levels. Microprocessor 66 monitors the contents of latch 28 and sends control signals to atttenuator 20 to dynamically reduce the attenuation, suitably by a factor of $2^N$. Then, when analog-to-digital conversion has taken place by ADC 26 and the corresponding binary word stored in latch/shift register 28, it is shifted N places to left, which accordingly divides the digital data by $2^N$. For example, if the attenuation is reduced by $2^4$ (signal level increased by a factor of 16), then the binary word is shifted four places to the left to divide the data by 16. This technique permits loop gain to remain constant while minimizing channel noise, thus improving the signal-to-noise ratio.

SIGNAL AVERAGING AND NOISE FILTERING

The system of FIG. 1 may be used to provide an average of each data point along a waveform by acquiring several waveforms and dividing by the number acquired. Thus, this system may be used to average out noise and random-occurring transients on an input signal, noise within the sampling loop, and even to eliminate the effects of system non-linearities. As seen above, loop gain may be determined as a function of voltage across the sampling gate 12. Forward gain FG of the sampling loop may be manually or automatically adjusted by changing the attenuation of attenuator 20 and by controlling the gain of AC amplifier 22. Moreover, as seen above, the binary word in latch/shift register 28 may be shifted. Since reverse gain RG is known, the sampling loop gain L may be determined and precisely adjusted to any value—unity, for example.

As defined earlier, the difference equation (1) describes the system of FIG. 1. For a randomly occuring noise spike X which occurs on the input signal for one instant, the solution to the difference equation is $$M(j,k) = \frac{XL}{RG}(1-L)^k + \frac{S(j)}{RG}, \quad (3)$$

wherein k=0 is the first pass in which the noise spike first occurs. For k=0, $$M(j,k) = \frac{XL}{RG} + \frac{S(j)}{RG}$$

so it can be seen that the effect of noise on the waveform is reduced (or increased) by loop gain L. The case for which k=0 is shown in FIG. 4A. Note that the noise spike occurs at the point where sampled, and is not smeared along the waveform as it was in prior art conventional samplers. The noise spike remains at the point where sampled, and decays out with the number of passes made, or number of sweeps made, instead of along the waveform. From equation (3), it may be demonstrated that the noise decays with increasing k rather than increasing j. This effect may be seen in FIGS. 4B and 4C, where k=1 and k=2, respectively. Of course, while the value of S(j) is shown at some constant level, the output M(j) is converging to the input signal with each pass, as the noise spike diminishes.

Classical samplers employed a technique called smoothing to reduce noise, and since this technique physically reduced the loop gain, dot transient response was affected and a step-function input waveform appeared on the display in distorted form in that the front edge was rolled off. As mentioned above, the system of FIG. 1 may be operated in a manner in which noise is reduced by an averaging technique. The following describes a method in which a waveform may be acquired and averaged efficiently.

The ability to control loop gain L permits a technique in which the loop gain may be set to a new value for each pass k of the waveform, decaying from L−1 to L=0, so that a display of M(j) immediately appears with the noisy signal and then the noise decays away, leaving the measured signal. Since a point-by-point averaging takes place, there is never any distortion on the waveform. The difference equation describing the system of FIG. 1 as an averaging filter is $$M(j,k) = \frac{c}{k+c}\left[\frac{S(j)}{RG} + \frac{k}{c} M(j,k-1)\right],$$

wherein c is a weighting factor and $L=c/(k+c)$. The following example, choosing c=1, illustrates the averaging technique. On the first pass (k=0), the contents of memory 32 are unknown, so it would be desirable to give zero weight to the memory contents for averaging purposes, and all of the weight to the input signal. This may be achieved by letting L=1/(0+1). After the first pass, memory 32 contains the input signal, plus any noise on the signal, plus noise generated inside the sampler, plus nonlinear errors from the sampler. For the next pass, loop gain becomes ½ so that the input signal and memory are weighted equally. Thus the signal remains in memory for the pass k=1, but the noise is reduced by one-half. For the next pass, k=2, L=1/3, and the memory is weighted 2/3 while the input signal is weighted ⅓. This process repeated until loop gain L reaches zero, and the noise has decayed away accordingly. Thus, it can be discerned that as k becomes larger, the input signal has less and less effect on the stored waveform; however, ultimately substantially all that is stored in memory is the measured input signal. The system performs as a true averaging filter since the true average may be obtained at each data point. Moreover, because each data point is completely decoupled from other points, selected data points may be averaged without acquiring the entire waveform for particular measurement situations, e.g. risetime measurements.

It should be noted that an approximation to a true average can be obtained by using only the shift register 28 to control loop gain. Also, other types of filters may be effected simply be controlling the weighting function.

RANDOM SAMPLING OPERATION

For random sampling, there is no predictability as to where along the waveform a sample will be taken at any given instant. That is, the entire waveform will be acquired; however, the sampled points are acquired in a random order. The location of each sampled point is measured with respect to a trigger point so that the acquired samples may be stored at the correct memory addresses and inserted into the display at the correct time position.

FIG. 5 shows a block diagram of the present invention modified for operation in a random sampling mode. Elements which have been described in connection with FIG. 1 perform the same function here and therefore retain the same reference numerals, and, since all of the modification is in the digital portion of the sampler, sampling gate 12, preamplifier 16, attenuator 20, AC amplifier 22, peak detector 24, and feedback attenuator 46 which comprise the analog portion will hereinafter be referred to as sampler input 80.

Since a fundamental characteristic of random sampling is that it is unpredictable at which point j along a waveform a sample is going to be taken at any instant, an actual estimator of the sample provided by the feedback portion of the sampling loop will occur only by coincidence, based on random probabilities. Thus, the system is said to run open loop much of the time. However, as will become apparent, previously stored waveform information, which is stored in digital memory 32 at the correct address locations, may be used as estimators for random sampling, with certain limitations imposed. First, it is assumed that the input signal is repetitive. Second, loop gain L must be unity (L=1) in order to acquire samples without gross errors being generating. As each estimator is issued from known memory addresses, acceptable limits are calculated from that estimator. Then a sample is taken, and if it is within the predetermined limits, it is stored in the memory, replacing the estimator at that particular address. If the sample taken is outside the predetermined limits, it is simply discarded. Eventually, the information stored at each memory address will converge to the exact waveform value.

As earlier described for sequential sampling operation, digital data M(j) from digital memory 32 is made available at the system output, and is also applied to latches 40 and 42 as an estimator M(j,k−1) of the next sample to be taken. However, for random sampling, the associated time base pseudo-randomly selects a point $j_n$ along the waveform to be sampled, which may or may not be the desired point j. The digitized sample FG S($j_n$)−LM(j,k−1) from latch 28 is added to the estimator M(j,k−1) from latch 40 by adder 30 to provide a sample $$m(j_n, k-1) = FG\, S(j_n) + (1-L) M(j, k-1), \quad (5)$$

which is latched into a latch-shift register 82 and then made available via a digital adder 84 to memory 32, where it may stored at the $j_n$ memory address. Note that if $L=1$, $m(j_n,k-1)=FG\, S(j_n)$. As a practical matter, it may be difficult to set L precisely to unity because of the open-loop operating condition, and thus, some error may be introduced. However, even with some error, $m(j_n,k-1)$ becomes an approximation of the input signal $S(j)$. The sample $m(j_n,k-1)$ is also latched into latch 86. A digital subtractor 88 subtracts the contents of latch 86 from the contents of latch 40 to produce an error signal $$E = M(j, k-1) - m(j_n, k-1). \quad (6)$$

The error signal E is applied to a digital comparator 90, where it is compared with a maximum acceptable value of E, the limits of which are calculated by microprocessor 66. The desirable condition, of course, is that $E=0$, indicating that the estimator $M(j,k-1)$ was correct and that the acquired sample $m(j_n,k-1)$ is valid. However, some small error may be tolerated, and if the error signal E is within predetermined limits, the output of digital comparator 90 notifies the system that $m(j_n,k-1)$ may stored at the $j_n$th location, thereby becoming $M(j_n)$. If error signal E is too large, the acquired sample $m(j_n,k-1)$ is discarded. The limits of E calculated by microprocessor 66 may decrease for each subsequent pass k, so that $M(j)$ converges to $S(j)$ for each point j.

It is important to understand that the point j corresponding to estimator $M(j,k-1)$ provided via latch 42 and DAC 44 to the sampler input 80 need not be identical to the point $j_n$ actually sampled, as long as error signal E is within the defined limits. It is prefectly reasonable to use estimators of the desired magnitude, even though from different points j, for random sampling operation. For example, for flat (unchanging) portions of the waveform, those sampled points j all have the same amplitude value, and, being identical, it does not matter which one of them is used as an estimator.

Non-linear error and noise in the system may be reduced by technique. An acquired sample $m(j_n,k-1)$ from digital adder 30 is routed via latch-shift register 82 and adder 84 to memory 32 where it is stored at the $j_n$ address and becomes $M(j_n,k-1)$, as discussed earlier. The stored sample $M(j_n,k-1)$ is also latched into latch 86 and applied to shift register 94. The data in both shift registers 82 and 94 is shifted N places to the left to divide the numerical value of the binary data by $2^N$. Thus, we may define a factor $Q=\frac{1}{2}^N$ so that the output of latch-shift register 82 is $Qm(j_n,k-1)$ and the output of shift register 94 is $QM(j_n,k-1)$. The output of shift register 94 is subtracted from the contents of latch 86 by digital subtractor 96 to produce $M(j_n,k-1)(1-Q)$, which is then added to the data in latch-shift register 82 by digital adder 84 to produce $$M(j_n, k) = QFG\, S(j_n) + Q(1-L)M(j_n, k-1) + M(j_n, k-1)(1-Q), \quad (7)$$

which is then placed back in memory location $(j_n,k)$ to be used as an estimate of the next sample. Notice that if $L=1$, the middle term of expression (7) drops out, leaving an equation similar to equation (5).

The error signal E produced by digital subtractor 88 and defined by equation (6) is used to determine which signals are to be stored and those that are to be discarded. Rewriting equation (7) in terms of E yields $$M(j_n, k) = M(j_n, k-1)(1-QL) + QFG\, S(j_n) + A(1-L)E. \quad (8)$$

which is the difference equation defining the system of FIG. 5. If the term $Q(1-L)E=0$, the difference equation would be of the type described for sequential sampling and, in fact, would behave exactly according to the analysis described earlier. To the extent that this is not true, that is, $Q(1-L)E \neq 0$, there will be an error term added to the measured signal, distorting it. The term $Q(1-L)E$ may be made equal to zero by making L equal to one; however, this is often difficult and can only be approximated because FG is a non-linear function. The term $Q(1-L)E$ may also be made equal to zero by making E equal to zero. While E cannot be forced to be zero, digital comparator 90 may be made to respond only to zero values of E in generating record commands. In other words, if $E \neq 0$, the sample is not recorded. If E is equal to zero, it is because $j_n$ was the correct waveform point or a point having the same voltage as point $j_n$. Either way, the system operated substantially closed loop. However, E does not have to be exactly zero to effect substantial improvement, and acceptable limits for E may be used. Since many samples may be discarded before one is recorded, time becomes a factor; however, the tradeoff in terms of reduced non-linearity or improved accuracy may be worth the time it takes for complete waveform acquisition. Moreover, since FG is a non-linear function, if E is constrained to a small value, FG may be predicted more closely and therefore $(1-L)$ may be made closer to zero. Thus, a double effect is achieved in making $Q(1-L)E$ closer to zero as hereinabove described.

TIMING AND CONTROL SYSTEM

FIG. 6 is a block diagram of an exemplary timing and control system for operating the sampling system hereinabove described, which in this illustration comprises sampling system 100 and digital memory 102. A programmable control and timing logic unit 104, operating in conjunction with a microcomputer 106, provides control and timing signals for operating the various latches and shift registers throughout the sampling system. An address counter 108, which receives reset and clock signals from logic unit 104, produces a serial count output in the form of binary data, which is applied via a multiplexer 110 as address data to digital memory 102. The serial count output from address counter 108 is also applied to a digital adder 112 which adds one to the address count signal.

In the sequential sampling mode of operation, address counter 108 contains the memory address of the point j that is currently being sampled. By adding one to the contents of address counter 108 and then multiplexing these two addresses to the memory address lines of memory 102 permits pipelining of the sampling process in that while a newly-taken sample is being converted to a digital word and not yet stored, the estimator for the point $(j+1)$ may be recalled from memory and placed on the sampling capacitor. Thereafter, the binary word corresponding to point j may be written into memory at the appropriate address corresponding to point j.

As with conventional sampling techniques, in this exemplary system strobe pulses for the sampling gate are developed by comparing fast ramp signals with slow ramp signals. The slow ramp signals are developed by applying address data to a latch and shift register 114 and converting these data to analog signals in a digital-to-analog converter (DAC) 116. The address data applied to latch and shift register 114 comprises the (j+1) data from digital adder 112 for the lower-order address bits and address data from microcomputer 106 for the upper bit positions. This arrangement allows the microcomputer to select where the "sample window" will occur along a given waveform thereby to facilitate sampling of selected portions of a given waveform. Shifting the data in the shift register portion of latch and shift register 114 has the effect of increasing the time interval; between sampling points, and therefore changing the horizontal time scale of the associated oscilloscope.

Fast ramp signals are developed in the conventional manner by a fast ramp generator comprising high-speed analog circuitry, such as a capacitor charged by a constant current. Fast ramp generator 118 may be combined with a digital delay selectable by address data from microcomputer 106 to facilitate sampling of selected portions of a given waveform. Of course, microcomputer 106 is also controlling latch and shift register 114, so that the sampling window may be precisely selected, permitting timing effects such as "magnified sweep" to be utilized.

The fast ramp signals from fast ramp generator 118 are compared with slow ramp signals form DAC 116 by a comparator 120 to generate strobe pulses in the conventional manner.

Operation of the digital delay and fast ramp generator 118 may be initiated by a signal from trigger generator 122, which suitably may be of the type commonly used in oscilloscopes, or the fast ramp generator may operate in a free-running mode, producing many fast ramps as the slow ramp runs up, such as may be desired for sequential sampling. Trigger generator 122 may suitably include a comparator which compares an electrical signal with a selectable reference level to establish a triggering point on the signal. For random sampling, it may be preferable to trigger on the signal to be sampled at a selected point so as to establish the same time reference for each subsequent frame. In that regard, the time between the triggering point and the sampling point may be precisely measured for each frame, and an address corresponding to the measured time interval produced to correctly place the acquired sample into its correct memory location. This may be accomplished by means of time interval meter 124, which receives the trigger and the sampling strobe and generates an analog voltage proportional to the time difference therebetween, and ADC 126, which converts the analog voltage to a corresponding digital memory address. The address from ADC 126 may be multiplexed by address MUX 110 and thereby routed to memory 102.

A multiplexer (MUX) 130 may be provided to permit selection of data to be stored in memory 102 from sampling system 100, microcomputer 106, or even the memory itself, facilitating a wide range of data manipulation and storage.

In summary, there has been shown and described a digital acquisition system including a high-speed analog sampling gate in accordance with the present invention. From the foregoing description, it will be apparent to those skilled in the art that many changes and modifications may be made without departing from the invention in its broader aspects. It is therefore contemplated that the appended claims will not be construed in a limiting sense and will cover any such modifications or embodiments as fall within the true scope of the invention.

What I claim as my invention is:

1. A method of generating a representation of a waveform, comprising the steps of:
    producing analog samples proportional to the magnitude of an input waveform at preselected time points therealong;
    converting said samples to digital representations thereof;
    storing said digital representations in storage locations associated with said preselected time points of said samples; and
    selectively retrieving said digital representations from a storage location associated with the next time point to be sampled and converting said stored digital representations to analog values to provide magnitude estimators for use in producing said samples.

2. A method in accordance with claim 1 further comprising the steps of:
    producing analog incremental difference values between said samples and said estimators; and
    converting said analog incremental difference values to digital values and algebraically adding said digital values to said selected digital representations thereby to produce new digital representations more closely representing the magnitudes at said selected points on the waveform.

3. A system for generating a representation of a waveform, comprising:
    means for producing analog samples proportional to at least a portion of the magnitude of an input waveform at preselected time points therealong;
    means for converting said samples to digital representations thereof;
    means for storing said digital representations in storage locations associated with said preselected time points of said samples;
    means for selectively converting said stored digital representations to analog values; and
    means for feeding said analog values back as magnitude estimators to said means for producing analog samples.

4. A system in accordance with claim 3 wherein said means for producing analog samples comprises an analog sampling gate and analog memory means, said analog memory means for storing said magnitude estimators for each sample to be taken.

5. A system in accordance with claim 4 wherein said converting means comprises an analog-to-digital converter.

6. A system in accordance with claim 5 wherein said analog sample producing means further comprises means for controlling the amplitude of said samples, and said converting means further comprises means for controlling the numerical value of digital representations, wherein said amplitude and numerical values are inversely proportional to each other so that overall gain remains substantially constant.

7. A system in accordance with claim 3 wherein said means for storing digital representations comprises a digital memory having a plurality of addressable storage locations, wherein each storage location corresponds to a predetermined time point along said waveform.

8. A system in accordance with claim 7 wherein said means for selectively converting stored digital representations to analog values includes means for retrieving digital representations from the storage location corresponding to the time point of the next sample, and digital-to-analog conversion means coupled to said digital memory to receive said selected digital representations, wherein the output of said digital-to-analog conversion means is coupled to said means for producing analog samples.

9. A system in accordance with claim 3 further comprising means for comparing a new sample and an estimator to determine the error magnitude therebetween, and means for comparing said error magnitude with a predetermined error limit thereby to determine whether the digital representation of the new sample should be stored in digital memory.

10. A waveform acquisition system, comprising:
   sampler input means for sampling an electrical signal;
   a forward signal processing path coupled to said sampler input means, including means for converting samples of said analog signal to digital representations thereof;
   a digital memory coupled to said forward signal processing path; and
   a feedback path from said digital memory to said sampler input, including means for converting digital signal representations to analog values for use as sample estimators.

11. A system in accordance with claim 10 wherein said sample input means produces analog voltages samples proportional to at least a portion of the magnitude of said electrical signal at preselected time points therealong, and said digital memory includes storage locations associated with said time points for storing said digital representations therein.

12. A system in accordance with claim 11 wherein said sampler input means comprises a sampling gate and analog memory means, said analog memory means for storing said sample estimators.

13. A system in accordance with claim 11 wherein said forward signal processing path further includes means for controlling the amplitude of said analog voltage samples and means for controlling the numerical value of said digital representations, wherein said amplitude and numerical values are inversely proportional to each other so that overall forward signal processing path gain remains constant.

14. A system in accordance with claim 13 wherein said amplitude control means and said numerical value control means are programmable.

15. A system in accordance with claim 13 further including logic control means for selectively retrieving digital representations from the storage location corresponding to the time point of the next sample to be taken, said selected digital representations being applied to said feedback path for conversion to estimators for said sampler input.

16. A system in accordance with claim 15 further including means for determining the gain of the loop comprised of said forward signal processing path and said feedback path and adjusting the loop gain to a predetermined value.

17. A system in accordance with claim 16 wherein said loop gain determining means comprises means for algebraically adding a known constant to the estimator, processing the constant through the forward signal processing path, measuring the numerical value thereof, and calculating loop gain therefrom.

18. A system in accordance with claim 15 further comprising means for comparing a new sample with the estimator therefor and producing an error signal, wherein said logic control means compares said error signal with a predetermined error limit to determine whether the digital representation of the new sample should be stored in memory.

19. A system in accordance with claim 15 wherein said logic control means comprises a digital processor.

* * * * *